United States Patent
Casagrande et al.

(10) Patent No.: US 6,627,931 B1
(45) Date of Patent: Sep. 30, 2003

(54) FERROELECTRIC MEMORY CELL AND CORRESPONDING MANUFACTURING METHOD

(75) Inventors: Giulio Casagrande, Vignate (IT); Raffaele Zambrano, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 6 days.

(21) Appl. No.: 09/610,311

(22) Filed: Jul. 5, 2000

(30) Foreign Application Priority Data

Jul. 5, 1999 (EP) .................................. 99830431

(51) Int. Cl.[7] ............... H01L 29/76; H01L 31/119; H01L 27/108; H01L 23/48
(52) U.S. Cl. ................... 257/295; 257/296; 257/306; 257/758
(58) Field of Search .................... 257/295, 758, 257/296, 306

(56) References Cited

U.S. PATENT DOCUMENTS

| | | | |
|---|---|---|---|
| 4,149,301 A | 4/1979 | Cook | 29/25.42 |
| 5,393,689 A * | 2/1995 | Pfiester et al. | 437/52 |
| 5,834,348 A | 11/1998 | Kwon et al. | 438/240 |
| 5,952,687 A * | 9/1999 | Kawakubo et al. | 257/296 |
| 5,955,774 A * | 9/1999 | Kang | 257/533 |
| 6,043,526 A * | 3/2000 | Ochiai | 257/295 |
| 6,078,072 A * | 6/2000 | Okudaira et al. | 257/295 |
| 6,316,801 B1 * | 11/2001 | Amanuma | 257/306 |

FOREIGN PATENT DOCUMENTS

| | | |
|---|---|---|
| EP | 0793274 A1 | 9/1997 |
| EP | 0905786 A1 | 3/1999 |

* cited by examiner

Primary Examiner—Eddie Lee
Assistant Examiner—Joseph Nguyen
(74) Attorney, Agent, or Firm—Lisa K. Jorgenson; Seed IP Law Group PLLC

(57) ABSTRACT

Presented is a memory cell integrated in a semiconductor substrate that includes a MOS device connected in series to a capacitive element. The MOS device has first and second conduction terminals, and the capacitive element has a lower electrode covered with a layer of a dielectric material and capacitively coupled to an upper electrode. The MOS device is overlaid by at least one metallization layer that is covered with at least one top insulating layer. The capacitive element is formed on the top insulating layer. The cell is unique in that the metallization layer extends only between the MOS device and the capacitive element.

12 Claims, 6 Drawing Sheets

FERROELECTRIC MEMORY CELL AND CORRESPONDING MANUFACTURING METHOD

TECHNICAL FIELD

This invention relates to a ferroelectric memory cell, and a method for its manufacture.

BACKGROUND OF THE INVENTION

Electronic memory devices that include ferroelectric components integrated on a semiconductor can include a number of ferroelectric memory cells organized in a matrix form of rows and columns, coupled by word and bit lines, respectively.

Each ferroelectric memory cell has a MOS transistor and a ferroelectric capacitor.

Known processes for manufacturing such memory cells include, after the MOS transistor is integrated in a semiconductor substrate, covering the entire chip surface with an insulating layer.

The ferroelectric capacitor is formed on top of this insulating layer. The capacitor conventionally includes a lower electrode of metal placed onto the insulating layer. A ferroelectric material layer covers the lower electrode, and a metal upper electrode is laid onto the ferroelectric layer.

An electrode of the ferroelectric capacitor is then connected to a conduction electrode of the MOS transistor.

After forming the ferroelectric memory cell, the next metallization layers are formed as necessary to complete the memory circuit structure.

This solution has a number of drawbacks. The required treatment for the provision of metallization levels can damage the properties of the ferroelectric materials, and with it, the performance of a ferroelectric memory cell.

A prior approach to attenuating this problem is described by Amanuma in an article "Capacitor-on-Metal/Via-stacked-Plug (CMVP) Memory Cell for 0.25 $\mu$m CMOS Embedded FeRAM", published in March 1998 by IEEE and incorporated herein by this reference in toto.

The article describes a ferroelectric memory cell comprising a MOS transistor integrated in a semiconductor, the formation of two metallization levels followed by the formation of a ferroelectric capacitor, and ultimately the formation of a final metallization layer.

Although achieving its objective, not even this solution is devoid of drawbacks. The provision of a final metallization layer after forming the ferroelectric capacitor results, in fact, in degradation of the ferroelectric material.

Until now, no memory device or process for making a memory device was available to provide a ferroelectric memory cell with such construction and functional features as to retain the ferroelectric characteristics of its component materials and overcome the limitations and drawbacks that still beset prior art ferroelectric memory devices.

SUMMARY OF THE INVENTION

Embodiments of the invention provide a memory structure which has at least one ferroelectric memory cell consisting of a MOS transistor connected to a ferroelectric capacitor, wherein the ferroelectric capacitor is formed after all the metallization levels of the memory structure have been formed.

Presented is a memory cell integrated in a semiconductor substrate that has a MOS device with an overlying metallization layer. An insulating layer covers the metallization layer. Over the insulating layer is formed a capacitive element having a lower electrode covered with a layer of a dielectric material and capacitively coupled to an upper electrode. The metallization layer extends only between the MOS device and the lower electrode of the capacitive element. Also presented is a method to make the cell just described.

The invention relates, particularly but not exclusively, to a non-volatile ferroelectric memory cell, and the description to follow deals with this field of application for simplicity.

BRIEF DESCRIPTION ON OF THE DRAWINGS

DETAILED DESCRIPTION OF THE INVENTION

Figure 1:
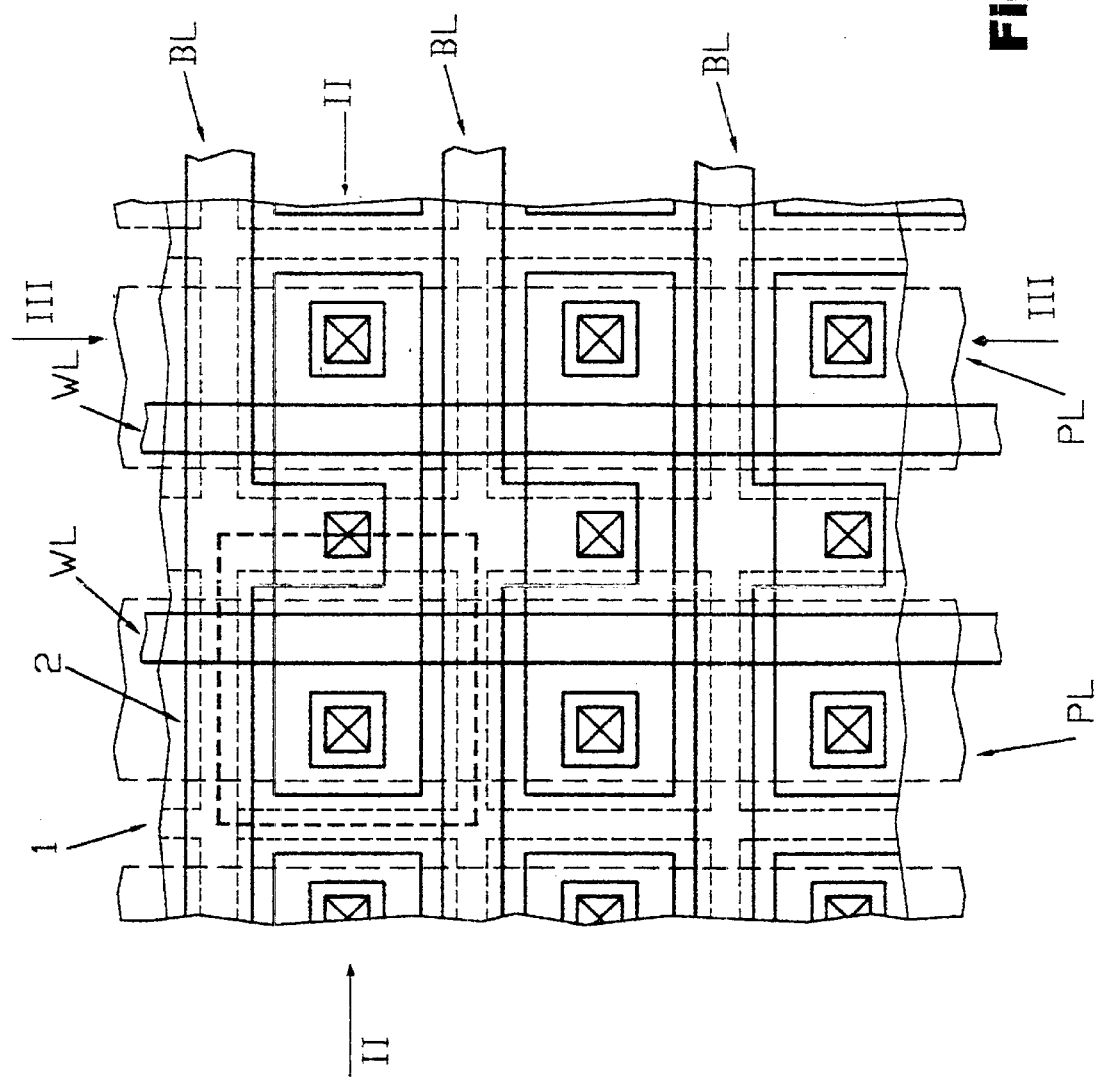
FIG. 1 is an layout view showing a portion of a memory matrix which has ferroelectric memory cells according to embodiments invention.

Referring to the drawing views, a ferroelectric memory cell according to an embodiment of the invention will now be described.

FIG. 1 shows a portion of a memory matrix 1 including a number of non-volatile ferroelectric memory cells 2, integrated on a semiconductor substrate 3. These cells 2 are laid into rows and columns, and are accessed through wordlines WL and bitlines BL. Each of the memory cells lies at a junction of one wordline WL and one bitline BL.

Figure 2:
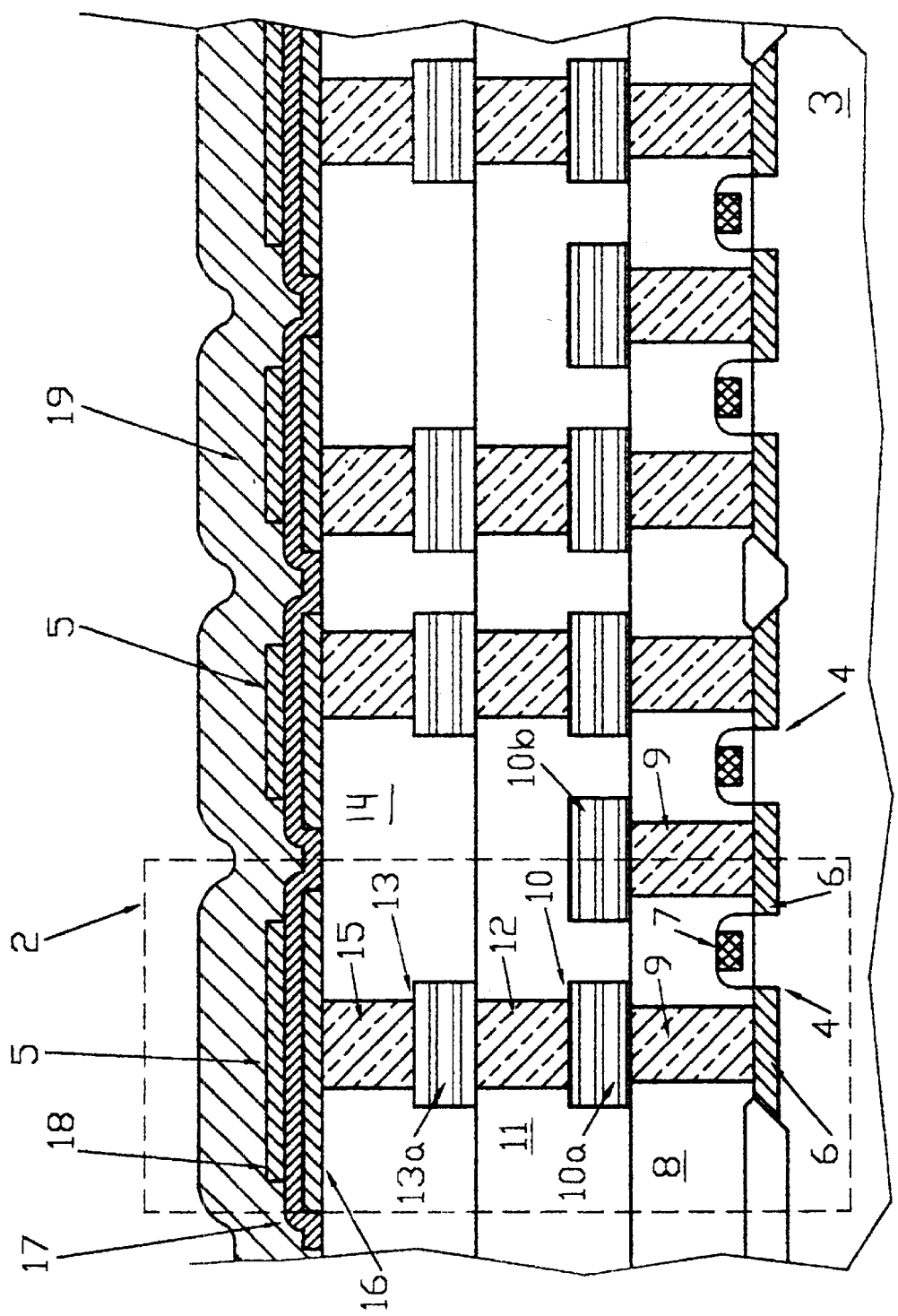
FIG. 2 is a sectional view of FIG. 1 taken along line II—II.
Figure 4:
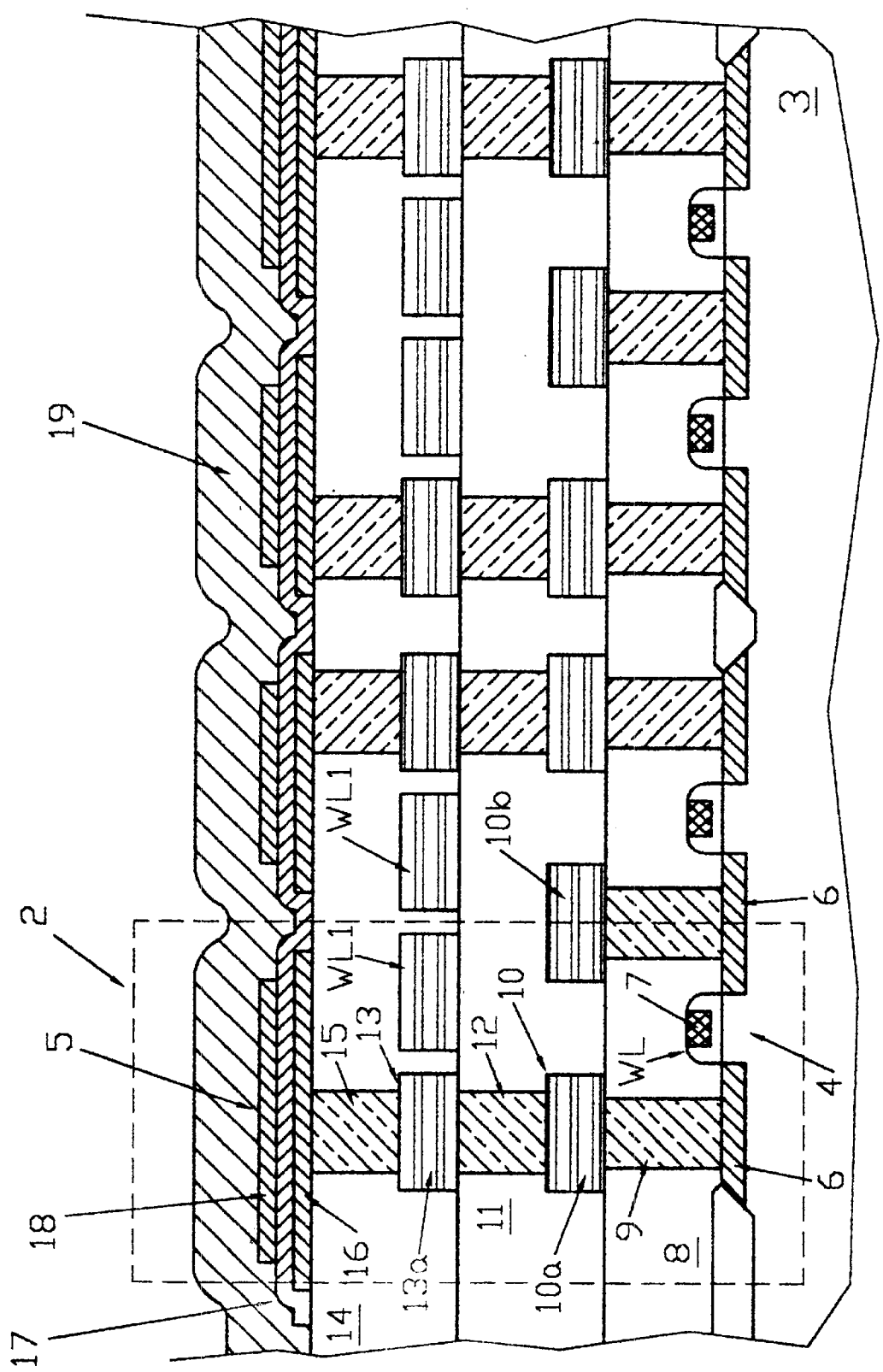
FIG. 4 is a sectional view, similar to FIG. 2, of another embodiment of the invention.

FIGS. 2 and 4 show a cross-sectional view of the ferroelectric memory cells 2. Each ferroelectric memory cell 2 includes a MOS transistor 4 coupled to a capacitive element 5.

Each MOS transistor 4 has first and second conduction terminals 6, which are formed in respective source and drain regions of the substrate 3.

A gate (or control) electrode 7 of polysilicon overlies the substrate region 3 between pairs of conduction terminals 6, and is isolated from the substrate surface by a thin oxide layer.

The gate electrodes 7 of transistors 4 in the same row are generally formed from polysilicon and coupled to a single word line WL, also generally formed from polysilicon. Each word line electrically interconnects the transistors 4 in the same row of the matrix 1.

In this configuration, adjacent pairs of transistors 4 in the same column BL have a conduction terminal 6 in common.

A protective insulating layer 8, such as an oxide doped with boron and phosphorus (BPSG), is then formed over the entire semiconductor surface. Respective openings are conventionally provided through the protective insulating layer 8 aligned with the conduction terminals 6, to form respective contacts 9.

Advantageously at this step, all the metallization levels that are necessary to complete the circuit structure in which the memory device 1 is integrated, are formed.

After the contact opening through the insulating layer 8 is formed, a first metallization layer 10 is formed conventionally, which is then patterned to provide specified electric interconnections.

In particular, a number of pads 10a are formed at the contacts 9 connected to the source terminal of the transistor 4, and a plurality of pads 10b are formed at the drain of the transistor 4 for connection to a respective bit line BL.

A second protective insulating layer 11 is subsequently formed to cover the semiconductor surface. Respective openings are provided through the insulating layer 11 aligned with the pads 10a for conventionally producing respective contacts 12.

A second metallization layer 13 is formed and then patterned to provide specified electric interconnections. In particular, a number of pads 13a are formed aligned with the contacts 12 that are connected to the source terminal of the transistor 4.

In a specially advantageous embodiment shown in FIG. 4, auxiliary word lines WL1 are formed from this metallization layer 13.

These word lines WL1 are placed in contact, outside the matrix 1, with the word lines WL which connect the gate electrodes 7 of the transistors 4.

In this way, the resistance of the polysilicon word lines WL can be made lower than only using the wordlines WL themselves, thereby making for faster response of the cells 2.

A third protective insulating layer 14 is subsequently formed over the semiconductor surface.

Respective openings are provided through the insulating layer 14 aligned with the pads 13a to enable the formation of respective contacts 15.

Ferroelectric capacitors 5 are then provided at each MOS transistor 4. Each ferroelectric capacitor 5 has a lower electrode 16 made of metal, e.g., of platinum, placed on the insulating layer 14 at the location of a respective contact 15.

In this particular embodiment, the lower electrode 16 advantageously overlaps the control electrode 7, at least partially.

A layer 17 of a ferroelectric material covers the lower electrode 16. Preferably, the ferroelectric material layer 12 covers the entire area occupied by the memory cells.

An upper electrode 18 of metal, e.g., of platinum, is then formed on the ferroelectric material layer 17. This upper electrode 18 is so defined as to overlap each lower electrode 16, at least partially.

Advantageously, the upper electrodes 18 of cells 2 in the same matrix row are connected into a single line PL designated "plate line", as shown in FIG. 1.

A passivation layer 19 is formed that covers the semiconductor surface.

All of the metallization levels 10, 13 are included between the MOS device and the lower electrode 16 of the capacitive element 5. In other words, no metallization levels are provided above the electrodes 16, 18 of the capacitor 5.

Figure 3:
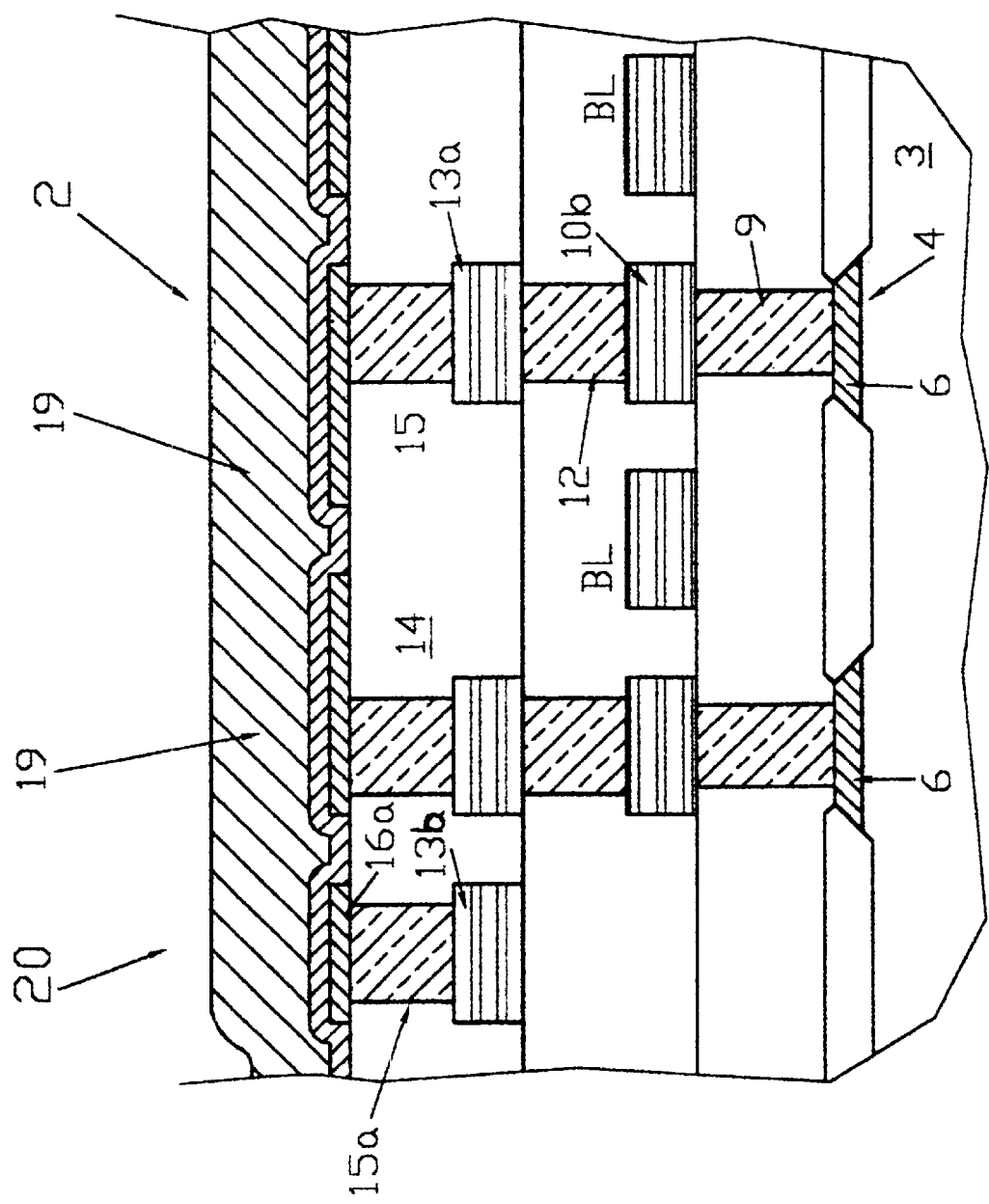
FIG. 3 is a sectional view of FIG. 1 taken along line III—III.

As shown in FIG. 3, an end termination 20 can be provided, outside the area of the memory matrix 1, which includes a pad 13b formed from the second metallization layer 13.

This pad 13b is overlaid by an associated contact 15a which is surrounded by the oxide layer 14. A flat 16a is formed, at the contact 15a, from the platinum layer from which the first plates 16 of the capacitor 5 were formed.

This flat 16a is then covered with the plate line PL interconnecting the upper plates 18 of the capacitors 5 in the same row of the matrix 1.

This solution allows the outputs from the memory cells (upper electrodes 18) to be driven and decoded through a metallization level provided beneath the ferroelectric capacitor 5.

Figure 5:
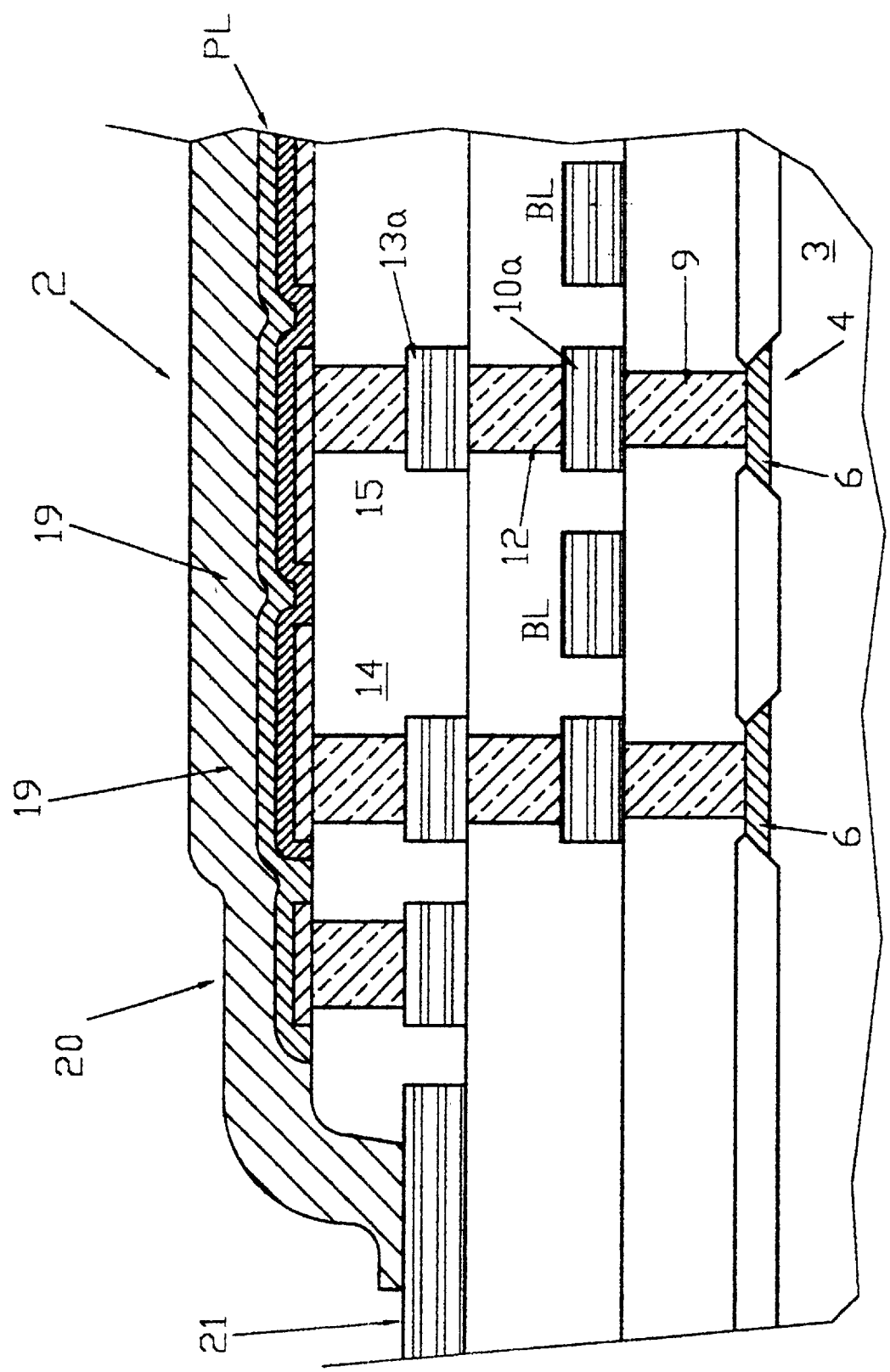
FIG. 5 is a sectional view of FIG. 1 taken along line III—III, also showing an external contact area for the memory matrix according to an embodiment of the invention.

Shown in FIG. 5 is a first embodiment of a possible area of connection to the output of the circuit. In this first embodiment, a pad area 21 is formed from the second metallization level 13, outside the matrix 1.

After the capacitors 5 are formed in the matrix 1 as previously described, the top insulating layer 14 and the passivation layer 19 are removed from a portion of the pad area 21 to provide for the connections to the output.

Figure 6:
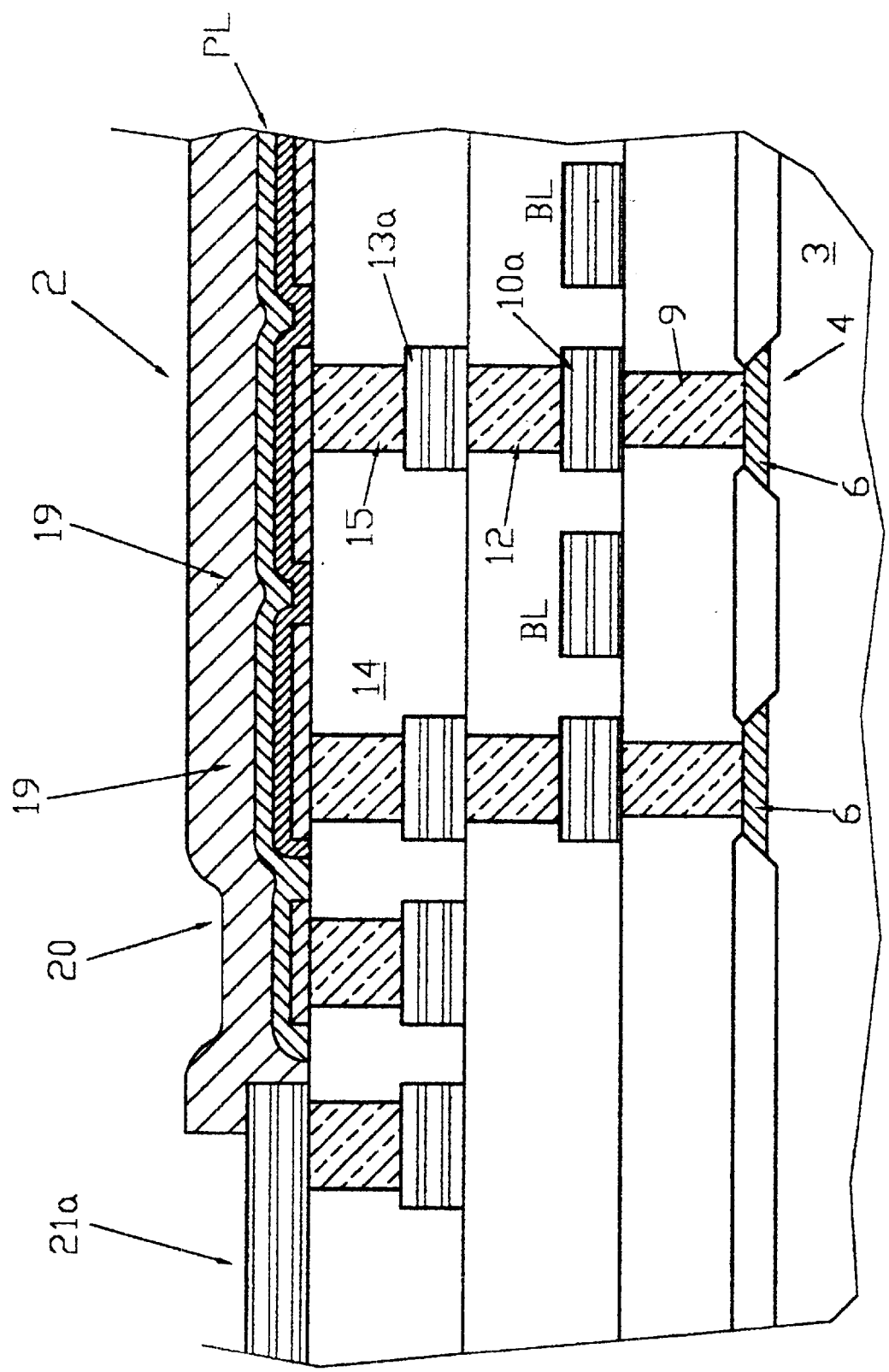
FIG. 6 is a sectional view of FIG. 1 taken along line III—III, also showing another embodiment of the external contact for the memory matrix.

Another possible embodiment of this pad area is illustrated in FIG. 6. In particular, after forming the protective insulating layer 14, a pad area 21a is provided outside the matrix area by the formation of a further metallization layer. Once this pad area 21a is formed, the capacitors 5 are formed as previously described.

The passivation layer 19 deposited over the entire semiconductor surface is then removed to produce the connections to the output.

In summary, the memory cell 1 enables the ferroelectric device to be fabricated after the last metallization layer has been formed. Thus, the problems involved in integrating the ferroelectric devices with standard CMOS fabrication processes have been reduced substantially.

Changes can be made to the invention in light of the above detailed description. In general, in the following claims, the terms used should not be construed to limit the invention to the specific embodiments disclosed in the specification and the claims, but should be construed to include all methods and devices that are in accordance with the claims. Accordingly, the invention is not limited by the disclosure, but instead its scope is to be determined by the following claims.

What is claimed is:

1. A memory cell integrated in a semiconductor substrate and comprising:
    a MOS device;
    a plurality of metallization layers including a first metallization layer, the plurality of metallization layers overlaying the MOS device;
    a top insulating layer covering the first metallization layer;
    a capacitive element formed on the top insulating layer, the capacitive element having a lower electrode covered with a layer of a dielectric material and capacitively coupled to an upper electrode, said capacitive element forming a part of a memory cell; and
    a flat formed on the top insulating layer, said flat electrically connected to a plate line electrically connected to the upper electrode, and said flat coupled by a contact to a pad of the first metallization layer such that the memory cell may be driven through the pad of the first metallization layer provided beneath the capacitive element.

2. The memory cell according to claim 1 wherein the capacitive element is a ferroelectric capacitor and the layer of dielectric material is a ferroelectric material layer.

3. The memory cell according to claim 1 wherein the memory cell is a non-volatile memory cell.

4. The memory cell according to claim 2 wherein the ferroelectric material layer covers the semiconductor substrate in a region occupied by memory cells.

5. A memory cell integrated in a semiconductor substrate, comprising:
   a MOS device;
   a first insulating layer covering the MOS device;
   a first contact formed in an opening in the first insulating layer;
   a first pad patterned from a metallization layer formed on the first insulating layer, said pad coupled to the contact to electrically couple the MOS device;
   a second pad patterned from the metallization layer formed on the first insulating layer, said second pad outside a memory matrix of which the MOS device forms a part;
   a second insulating layer overlying said first and said second pad;
   a ferroelectric capacitor having a first electrode closer to the substrate capacitively coupled to a second electrode that is farther from the substrate, said first electrode formed on top of the second insulating layer; and
   a third pad formed on top of the second insulating layer outside a memory matrix of which the MOS device forms a part, said third pad coupled to said second pad by a contact and a fourth pad patterned from the metallization layer formed on the first insulating layer, said fourth pad electrically connected with said second pad and said second pad electrically connected with the second electrode.

6. The memory cell of claim 5 wherein the electrodes of the capacitor are separated by a ferroelectric material layer.

7. The memory cell of claim 6 wherein the ferroelectric material layer covers the semiconductor substrate in a region occupied by memory cells.

8. A memory cell integrated in a semiconductor substrate and comprising:
   a MOS device;
   a plurality of metallization layers including a top metallization layer, the plurality of metallization layers overlaying the MOS device;
   a plurality of contacts electrically coupling the metallization layers;
   a plurality of insulating layers covering the metallization layers;
   a capacitive element formed above the metallization layers and the insulating layers, the capacitive element having a lower electrode, covered with a layer of a dielectric material and capacitively coupled to an upper electrode, wherein the plurality of metallization layers, the plurality of contacts, and the plurality of insulating layers extend only between the MOS device and the capacitive element; and
   a pad formed on an insulating layer upon which the lower electrode is formed, said pad outside a memory matrix of which the MOS device forms a part, said pad electrically coupled to a flat formed on the insulating layer upon which the lower electrode is formed, said flat electrically connected to the upper electrode by a plate line.

9. A memory cell integrated in a semiconductor substrate and comprising:
   a MOS device;
   a plurality of metallization layers including a top metallization layer, the plurality of metallization layers overlaying the MOS device;
   a top insulating layer covering the top metallization layer;
   a capacitive element formed on the top insulating layer, the capacitive element having a lower electrode covered with a layer of a dielectric material and capacitively coupled to an upper electrode, wherein the plurality of metallization layers extend only between the MOS device and the capacitive element; and
   a pad formed on an insulating layer upon which the lower electrode is formed, said pad outside a memory matrix of which the MOS device forms a part and said pad electrically coupled to the upper electrode through a plate line.

10. The memory cell of claim 1 wherein said flat further comprises:
    a contact extending through the first insulation layer and contacting the first metallization layer.

11. The memory cell of claim 1 further comprising:
    a pad formed on an insulating layer below the top insulating layer, said pad positioned laterally from the MOS device and the capacitive element, and said pad only partially covered by a passivation layer.

12. The memory cell of claim 1 further comprising:
    a pad formed on the top insulating layer, said pad positioned laterally from the MOS device and the capacitive element, and said pad only partially covered by a passivation layer.

* * * * *